United States Patent
Beringov et al.

(10) Patent No.: US 9,410,266 B2
(45) Date of Patent: Aug. 9, 2016

(54) PROCESS FOR PRODUCING MULTICRYSTALLINE SILICON INGOTS BY THE INDUCTION METHOD, AND APPARATUS FOR CARRYING OUT THE SAME

(71) Applicants: Sergii Beringov, Kiev (UA); Volodymyr Onischenko, Kiev (UA); Anatoliy Shkulkov, St. Petersburg (RU); Yurii Cherpak, Kiev (UA); Sergii Pozigun, Kiev (UA); Stepan Marchenko, Kiev (UA); Andrii Shevchuk, Kiev (UA)

(72) Inventors: Sergii Beringov, Kiev (UA); Volodymyr Onischenko, Kiev (UA); Anatoliy Shkulkov, St. Petersburg (RU); Yurii Cherpak, Kiev (UA); Sergii Pozigun, Kiev (UA); Stepan Marchenko, Kiev (UA); Andrii Shevchuk, Kiev (UA)

(73) Assignee: SoLin Development B.V., Amsterdam Zuidoost (NL)

( * ) Notice: Subject to any disclaimer, the term of this patent is extended or adjusted under 35 U.S.C. 154(b) by 0 days.

(21) Appl. No.: 14/583,141

(22) Filed: Dec. 25, 2014

(65) Prior Publication Data

US 2015/0107304 A1 Apr. 23, 2015

Related U.S. Application Data

(63) Continuation-in-part of application No. 13/139,612, filed as application No. PCT/UA2009/000067 on Dec. 14, 2009, now abandoned.

(30) Foreign Application Priority Data

Dec. 15, 2008 (UA) .................................. 200814479

(51) Int. Cl.
*C30B 15/08* (2006.01)
*C30B 28/06* (2006.01)
*C30B 29/06* (2006.01)
*C30B 30/04* (2006.01)
*C30B 35/00* (2006.01)
*C30B 11/00* (2006.01)

(52) U.S. Cl.
CPC ............... *C30B 28/06* (2013.01); *C30B 11/003* (2013.01); *C30B 11/006* (2013.01); *C30B 29/06* (2013.01); *C30B 30/04* (2013.01); *C30B 35/005* (2013.01)

(58) Field of Classification Search
CPC ...... C30B 15/00; C30B 15/002; C30B 15/02; C30B 15/08; C30B 15/20; C30B 15/206; Y10T 117/00; Y10T 117/10; Y10T 117/1016; Y10T 117/1024; Y10T 117/1032; Y10T 117/1056; Y10T 117/1068; Y10T 117/1072
USPC ............... 117/11, 13, 30, 33–35, 73, 81, 200, 117/204, 206, 223, 931–932
See application file for complete search history.

(56) References Cited

U.S. PATENT DOCUMENTS

| 4,572,812 A | 2/1986 | Ciszek |
| 6,027,563 A * | 2/2000 | Choudhury ........... C30B 11/003 117/18 |
| 7,368,368 B2 * | 5/2008 | Emerson ............. C23C 16/4408 257/E21.108 |
| 2008/0179037 A1 | 7/2008 | Yoshihara et al. |
| 2008/0283211 A1 | 11/2008 | Hong |

FOREIGN PATENT DOCUMENTS

| EP | 1754806 | 2/2007 |
| EP | 1754806 A1 * | 2/2007 |

* cited by examiner

*Primary Examiner* — Kenneth A Bratland, Jr.
(74) *Attorney, Agent, or Firm* — Werner & Burt, P.C.; Irving M. Werner; Pamela S. Burt

(57) ABSTRACT

An apparatus and continuous stable process for producing multicrystalline silicon ingots with large cross-sections by an induction method, by maintaining surface temperature of the ingot at the output of the crucible within the range of 900-1150° C., and by heating the ingot at the output of the upper zone of the controlled cooling compartment to a temperature of 1200-1250° C., followed by cooling of the ingot at a rate of no more than 10° C./cm.

1 Claim, 7 Drawing Sheets

PROCESS FOR PRODUCING MULTICRYSTALLINE SILICON INGOTS BY THE INDUCTION METHOD, AND APPARATUS FOR CARRYING OUT THE SAME

CROSS-REFERENCE TO RELATED PATENT APPLICATIONS

The present patent application is a continuation-in-part of U.S. patent application Ser. No. 13/139,612 filed Jun. 14, 2011, which in turn is a 35 USC 371 United States National Stage application of International Application Number PCT/UA2009/000067 filed Dec. 14, 2009, which in turn claims priority from Ukraine Patent Application a2008 14479 filed Dec. 15, 2008.

BACKGROUND OF THE INVENTION

The invention relates generally to producing polycrystalline silicon, and particularly to producing multicrystalline silicon by the induction method for use in the manufacture of solar cells.

Crystal silicon is used for producing solar cells to converse solar energy into electrical energy. Single-crystal silicon is usually used for this purpose.

Recently completed research has demonstrated that polycrystalline silicon formed by the large crystals, so called multicrystalline silicon, allowed to reach the efficiency of converting solar energy into electric energy close to that of single-crystal silicon. Production capacity of equipment for producing multicrystalline silicon is several times higher than for single-crystal silicon, and its technology is easier than the technology for obtaining single-crystal silicon. The use of multicrystalline silicon enables to reduce the cost of solar panels and to start their production on an industrial level.

Currently in use is a process for producing multicrystalline silicon ingots by the induction method comprising a continuous supplying, and an induction melting of polycrystalline lump silicon batch material in a silicon melt-pool on a movable bed of a water-cooled crucible, casting the molten silicon to the shape of the melting space, and subsequent crystallizing a multicrystalline silicon ingot (U.S. Pat. No. 4,572,812). The melt-pool is contained within a skull formed using the water-cooled crucible consisting of the vertical copper tube sections cooled with water. The copper sections are separated by gaps and form a melting volume enclosed on the perimeter. Gaps between the sections permit inductor electromagnetic field to penetrate into the crucible melting volume. The melting volume can be shaped as a circle, a square, or a rectangle. During melting, a melt-pool fills up the entire transverse area of the crucible, thus resulting both in melting and casting of the silicon pool as an ingot of specific transverse size and shape. As the silicon batch melts, and the crucible movable bottom moves downwardly, the pool in the bottom part of the melt-pool is crystallizing. The speed of ingot movement corresponds to the speed of the lump batch melting in the upper part of the melt-pool. As a result of this known method, a long multicrystalline silicon ingot with a specified cross-section is produced and later on used in the production of solar cell plates.

A disadvantage of the above process for producing multicrystalline silicon ingots by the induction method is the appearance of thermal stress in the ingot resulting in lower quality degradation of plates produced using such ingot. Thermal stresses in the ingot and in the plates made of such ingot results in decreased efficiency of energy conversion by solar cells formed of these plates. In addition, the output factor of good plates also decreases due to their rupture caused by thermal stresses.

The identified problems are resolved by the process of producing multicrystalline silicon ingots by induction method that is described in EP 1254861. According to this known process there is provided additional heating of a silicon ingot obtained in the process of continuous casting by using heaters located underneath the water-cooled crucible, and additional heating of the ingot by plasma discharge of a plasmatron located above the water-cooled crucible. At the same time, the plasma discharge is scanning over the pool surface. Using this process enables controlled cooling of the obtained ingot within the predetermined temperature gradient at length. Electric circuit for the plasmatron is looped at the silicon ingot through a special contact that is arranged underneath the place where the ingot exits the processing chamber. The method provides reducing the temperature gradient over the silicon ingot radius down to 9 to 7° C./m, and thus results in achievement of a high efficiency (14.2 to 14.5%) of converting solar energy into electric energy for the plates made of this ingot.

However, during continuous melting and production of long ingots of multicrystalline silicon with a permanent supply of lump batch to the melt-pool, only at the beginning of the process, the concentration of impurities in the melt-pool is fitting with the concentration of impurities in the loaded batch. Concentration of impurities in an ingot is defined by the segregation factor of each impurity. Inasmuch as the segregation factor for typical impurities in the source material is lower than 1, the concentration of each impurity in the ingot is lower than its concentration in the melt. As much as the ingot grows longer, the concentration of impurities in the melt-pool increases due to its accumulation, and consequently the concentration in the produced multicrystalline ingot also increases. When the concentration of impurities in the pool exceeds its limit established for each specific impurity, the multicrystalline silicon becomes unsuitable for producing solar cells. The parts of the ingot with the concentration of impurities higher than the prescribed limit cannot be used for producing solar cells and are rejected, thereby significantly decreasing a fraction of produced solar cells with a high conversion efficiency.

The method of EP 1754806 comprises charging and start-up heating a lump of silicon charge material in a controlled atmosphere on a movable bottom within the melting space of a water-cooled crucible, creating a bath of molten silicon, and subsequently melting and casting the molten silicon to the shape of the melting space, crystallizing a multicrystalline silicon ingot, and controllably cooling the silicon ingot using a heating equipment set. As the multicrystalline silicon ingot cools down, it is removed from the processing chamber via a gas seal which prevents atmospheric air from penetrating into the chamber, and is cut down into cut-to-length sections by a cutter. In order to increase the efficiency of the method, after a permissible limit of impurities concentration is reached in the pool, the melting process is stopped, the melt-pool is crystallized, and a separation device is drawn down into the crystallized ingot in the melting volume of the water-cooled crucible to block the melting volume and prevent impure silicon from the bottom surface of the separation device from entering the upper surface. At the same time, the initial lump batch of silicon is supplied onto the upper surface of the separation device, and the operations are repeated starting from supply and start heating of silicon lump batch.

The prior art method has the following drawbacks.

When induction melting and casting are stopped, if impurities reach their critical content in the pool in the process of obtaining a long ingot (e.g., 14 m long), the entire upper part of the ingot—approximately 2.5 m long—located inside the heating equipment and processing chamber (above the gas seal) should run the step of controlled cooling. For this purpose the controlled cooling is carrying out in the mode similar to the one used for the whole ingot and this step takes approximately 30 hours. In addition, each step of inserting the separation device into the furnace melting volume and resuming the process of melting and casting takes about 7.2 hours. During this period, induction melting and casting of the pool is not provided.

The step of inserting a separation device into a melting volume requires high precision, since even a small misalignment error during the installation of the separation device may result in its jamming and damage of the water-cooled crucible, consequently resulting in the compulsory termination of melting and casting.

Also, inserting of a separation device made of foreign material—specifically silicon nitride, or graphite—into the melt-pool gives rise to contamination of the lower part of the ingot which becomes impure, and as a result to reduce quality and output factor of good silicon. The need to resume melting on the top of the already produced silicon ingot leads to the need for stopping its movement into the heating equipment and keeping it inside the water-cooled crucible for a long time. This results in uncontrolled cooling of this part of the ingot, appearance of thermal stresses and microcracks in that area, and consequently, in the need for rejecting the upper part of the ingot.

BRIEF SUMMARY OF THE INVENTION

The present invention provides an apparatus for producing multicrystalline silicon ingots by an induction method, comprising: an air-tight, one-piece, unitary, integral chamber; a water-cooled crucible located within said air-tight, one-piece, unitary, integral chamber; an inductor coil located within said air-tight, one-piece, unitary, integral chamber and surrounding said water-cooled crucible; a first movable structure located within said air-tight, one-piece, unitary, integral chamber; a first melting space formed by said water-cooled crucible and said first movable structure; a charging bin having an exit portion extending into said air-tight, one-piece, unitary, integral chamber and located and configured to download a lump silicon charge material into said first melting space; a movable, start-up heating device located within said air-tight, one-piece, unitary, integral chamber and configured to be inserted into said first melting space for melting the lump silicon charge material under the influence of radiated heat and an electromagnetic field generated by said inductor coil; said movable, start-up heating device being made of conductive material; a first movable rod extending into said air-tight, one-piece, unitary, integral chamber; said first movable rod being connected to said first movable structure for moving said first movable structure vertically within said air-tight, one-piece, unitary, integral chamber; a controlled cooling compartment located within said air-tight, one-piece, unitary, integral chamber beneath said water-cooled crucible; a first heating equipment set located within said controlled cooling compartment; said first movable structure being configured to move vertically along said first heating equipment set; a second movable structure located within said air-tight, one-piece, unitary, integral chamber; a second melting space formed by said water-cooled crucible and said second movable structure; said charging bin having said exit portion extending into said air-tight, one-piece, unitary, integral chamber and located and configured to download lump silicon charge material into said second melting space; said movable, start-up heating device located within said air-tight, one-piece, unitary, integral chamber and configured to be inserted into said second melting space for melting lump silicon charge material under the influence of radiated heat and an electromagnetic field generated by said inductor coil; a second movable rod extending into said air-tight, one-piece, unitary, integral chamber; said second movable rod being connected to said second movable structures for moving said said second movable structure vertically within said air-tight, one-piece, unitary, integral chamber; a second heating equipment set located within said controlled cooling compartment; said heating equipment sets being mounted on a platform within said controlled cooling compartment located within said air-tight, one-piece, unitary, integral chamber beneath said water-cooled crucible; a rotatable axle located between said first and second heating equipment sets within said air-tight, one-piece, unitary, integral chamber; said platform being configured to rotate 180-degrees around said axle; a discharge device connected to said air-tight, one-piece, unitary, integral chamber through a gas seal; whereby a multicrystalline silicon ingot is steadily moved downwardly into said controlled cooling compartment toward an associated heating equipment set where controlled cooling is provided firstly by increasing the surface temperature of said multicrystalline silicon ingot at the output of said water-cooled crucible from 900-1150° C. to a temperature of 1200-1250° C. at an output of an upper zone of said controlled cooling compartment, and then by cooling of said multicrystalline silicon ingot with a thermal gradient of no more than 10° C./cm to remove thermal stresses.

The present invention also provides a process for producing multicrystalline silicon ingots by an induction method, comprising the steps of: providing an air-tight, one-piece, unitary, integral chamber; providing a water-cooled crucible located within said air-tight, one-piece, unitary, integral chamber; providing an inductor coil located within said air-tight, one-piece, unitary, integral chamber and surrounding said water-cooled crucible; providing a first movable structure located within said air-tight, one-piece, unitary, integral chamber; providing a melting space formed by said water-cooled crucible and said movable structure; providing a charging bin having an exit portion extending into said air-tight, one-piece, unitary, integral chamber and located and configured to download a lump silicon charge material into said first melting space; providing a movable, start-up heating device located within said air-tight, one-piece, unitary, integral chamber and configured to be inserted into said first melting space for melting said lump silicon charge material under the influence of radiated heat and an electromagnetic field generated by said inductor coil; providing said movable, start-up heating device being made of conductive material; providing a first movable rod extending into said air-tight, one-piece, unitary, integral chamber; providing said first movable rod being connected to said first movable structure for moving said first movable structure vertically within said air-tight, one-piece, unitary, integral chamber; providing a controlled cooling compartment located within said air-tight, one-piece, unitary, integral chamber beneath said water-cooled crucible; providing a first heating equipment set located within said controlled cooling compartment; configuring said first movable structure to move vertically along said first heating equipment set; providing a second movable structure located within said air-tight, one-piece, unitary, integral chamber; providing a second melting space formed by said water-cooled crucible and said second movable structure; providing said charging bin having said exit portion extending into said air-tight, one-piece, unitary, integral chamber and located and configured to download lump silicon charge material into said second melting space; providing said movable, start-up heating device located within said air-tight, onepiece, unitary, integral chamber and configured to be inserted into said second melting space for melting lump silicon charge material under the influence of radiated heat and an electromagnetic field generated by said inductor coil; providing a second movable rod extending into said air-tight, one-piece, unitary, integral chamber; connecting said second movable rod to said second movable structure for moving said second movable structure vertically within said air-tight, one-piece, unitary, integral chamber; providing a second heating equipment set located within said controlled cooling compartment; mounting said heating equipment sets on a platform within said controlled cooling compartment located within said air-tight, one-piece, unitary, integral chamber beneath said water-cooled crucible; providing a rotatable axle being located between said first and second heating equipment sets within said air-tight, one-piece, unitary, integral chamber; configuring said platform to rotate 180-degrees around said axle; providing a discharge device connected to said air-tight, one-piece, unitary, integral chamber through a gas seal; charging and start-up heating lump silicon charge material in a controlled atmosphere on said first movable structure within said first melting space of said water-cooled crucible; creating a bath of molten silicon; melting and casting the molten silicon to the shape of said first melting space; crystallizing a multicrystalline silicon ingot; controllably cooling the multicrystalline silicon ingot firstly by increasing the surface temperature of said multicrystalline silicon ingot at an output of said water-cooled crucible from 900-1150° C. to a temperature of 1200-1250° C. at an output of an upper zone of said controlled cooling compartment, and then by cooling of said multicrystalline silicon ingot with a thermal gradient of no more than 10° C./cm terminating the steps of melting and casting when content of impurities in the molten silicon becomes critical; moving the multicrystalline silicon ingot steadily downwardly into said controlled cooling compartment toward said first heating equipment set where controlled cooling is provided and thermal stresses are removed; upon completion of crystallization, the silicon ingot is vacated together with said first movable structure and said first heating equipment set, and further cooled in a controlled manner; at the same time, said second heating equipment set and said second movable structure are rotated on said platform into the vacated space; and moving said second movable structure into said water-cooled crucible; and repeating the steps to produce the next ingot.

An object of the invention is to produce multicrystalline silicon ingots with a large cross-section (330×330 mm² and more).

Another object of the invention is to provide a continuous stable process of producing multicrystalline silicon ingots with large cross-sections by the induction method wherein the surface temperature of the ingot at the output of the crucible is maintained within the range of 900-1150° C., and the ingot is heated at the output of the upper zone of the controlled cooling compartment (preferably having a length equal to 20% of the total length of the cooling compartment) to a temperature of 1200-1250° C., followed by cooling of the ingot at a rate of not more than 10° C./cm.

Another object of the invention is to improve the process for producing multicrystalline silicon ingots by the induction method which leads to increased output of multicrystalline silicon suitable for producing solar cells due to the proposed relocation of an ingot and heating equipment with a movable bottom during controlled cooling.

Another object of the invention is to upgrade the apparatus for producing multicrystalline silicon which increases production capacity of obtaining multicrystalline silicon ingots suitable for producing solar cells.

The invention is not limited by the accompanying drawings.

DETAILED DESCRIPTION OF BEST MODE OF THE INVENTION

Figure 1:
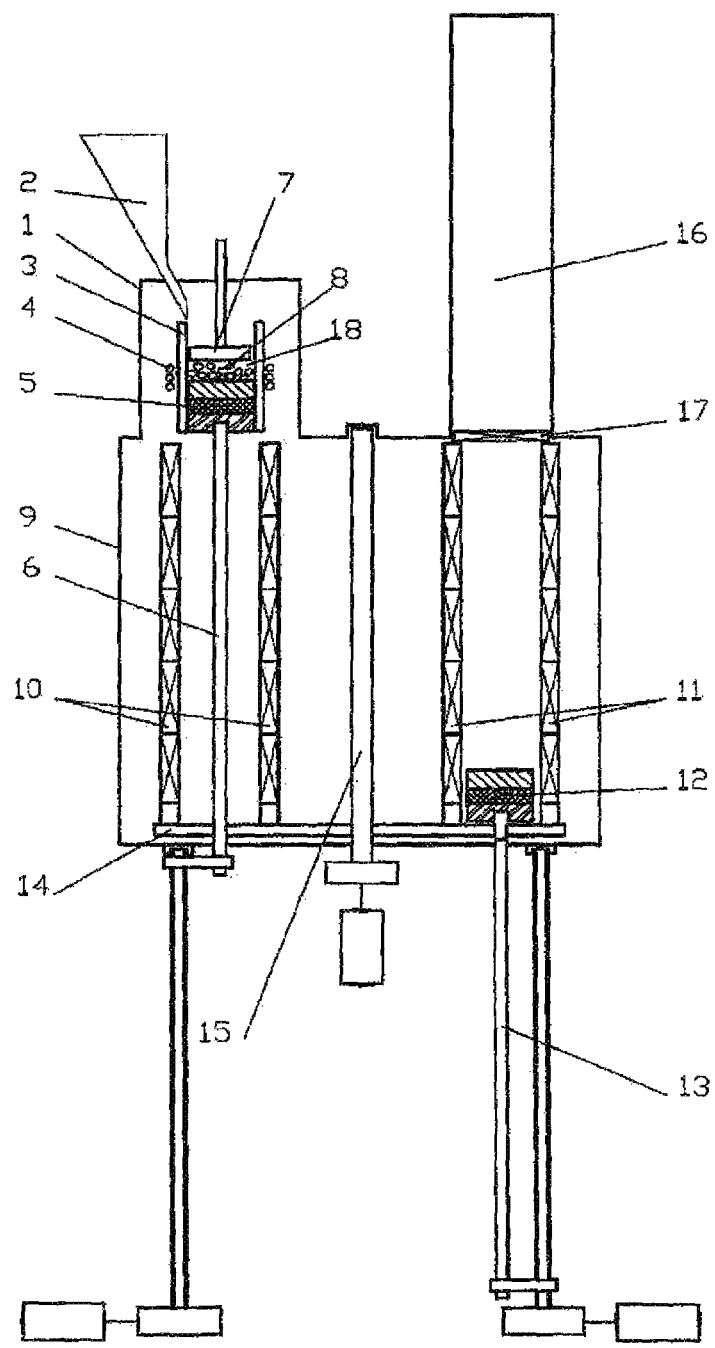
FIG. 1 shows an embodiment of the apparatus at a start-up heating step.

The invention provides a method of obtaining multicrystalline silicon ingots using induction, comprising the steps of: charging and start-up heating a lump silicon charge material in a controlled atmosphere on a movable bottom within the melting space of a water-cooled crucible, creating a bath of molten silicon; subsequently melting and casting the molten silicon to the shape of the melting space; crystallizing a multicrystalline silicon ingot; and controllably cooling the silicon ingot using a heating equipment set, terminating the steps of melting and casting when the content of impurities in the molten silicon becomes critical, and repeating the process steps starting from the steps of charging and start-up heating the lump silicon charge material.

According to the invention, upon terminating the steps of melting and casting, the step of crystallizing the remaining part of the multicrystalline silicon ingot is finished as the whole ingot is controllably cooled. Upon completion of crystallization, the multicrystalline silicon ingot is removed together with the movable bottom and the heating equipment set, and further cooled in a controllable manner. At the same time, another heating equipment set including another movable bottom is supplied to the vacated space. Then said another movable bottom is moved into the water-cooled crucible; and the process steps are repeated in order to produce the next ingot.

A simultaneous removal of the multicrystalline silicon ingot with the heating equipment set and the supply of another heating equipment set together with another movable bottom is done by a 180-degree rotary turn in a preferred embodiment of the invention.

Another aspect of the invention provides an apparatus for carrying out the process for producing multicrystalline silicon ingots by the induction method, wherein the apparatus comprises: a chamber connected to a charge bin; the chamber including a water-cooled crucible enveloped by an inductor; a device for start-up heating of a lump silicon charge material; a movable bottom with a rod connected to a movement means; a controlled cooling compartment arranged underneath the water-cooled crucible and including a heating equipment set; the movable bottom being movable up and down along the heating equipment set.

The apparatus further comprises a platform installed in the controlled cooling compartment and capable of rotation about an axis whereon the heating equipment set is mounted.

The apparatus has at least one more heating equipment set installed on the platform, and another movable bottom arranged in said another heating equipment set together with a rod connected to a suitable movement means therefor.

In one of the embodiment of the invention the apparatus may contain two heating equipment sets installed on the platform symmetrical around an axis of rotation. At the same time, each of the heating equipment sets has an algorithm for changing temperature vertically to ensure an established temperature gradient is maintained in the produced multicrystalline silicon ingot.

By simultaneous implementation of induction melting and casting first, together with the controlled cooling, and then, after stopping of the induction melting—crystallization of the remaining part of the ingot and continuation of the controlled cooling of the ingot in the process of preparing and beginning the production of the next ingot, there is achieve production of ingots with a controlled content of impurities.

Furthermore, the staging of the controlled cooling of a multicrystalline silicon ingot which can be implemented without interrupting the overall cooling process allows flexibility in regulating the length of the produced ingot depending on the amount of impurities in the starting batch.

The inventive process, characterized by a high production output of ingots suitable for producing solar batteries, and can be used for batches with a high content of impurities.

A reduced period of induction melting downtime, and lack of dependency of a part of the controlled cooling process on melting and casting processes result in increase capacity of the system for producing multicrystalline silicon.

The apparatus for producing multicrystalline silicon ingots by using the induction method is shown in FIG. 1, and comprises a chamber 1 connected to a charging bin 2, a water-cooled crucible 3 enveloped by an inductor 4, a movable bottom 5 with a rod 6 connected to movement devices.

A start-up heating device 7 of lump silicon charge material 8 is installed inside the chamber 1.

The start-up heating device 7 is made of conductive material, e.g., graphite.

The water-cooled crucible 3 is made of copper sections cooled with water.

In the chamber 1, underneath the water-cooled crucible, a controlled cooling compartment 9 including a heating equipment set 10 and a similar heating equipment set 11 are located.

The movable bottom 5 is arranged to move vertically along the heating equipment set 10.

The heating equipment set 11 consists of a movable bottom 12 with a rod 13 connected to the corresponding movement devices.

The movable bottom 12 can move vertically along the heating equipment set 11.

The heating equipment sets 10 and 11 are installed on a platform 14.

The platform 14 is placed in the controlled cooling compartment 9, and is able to rotate about an axis 15.

The chamber 1 is connected to a discharge device 16 through a gas seal 17.

The apparatus works as follows.

In the chamber 1, under a controlled atmosphere, the movable bottom 5 is moved toward the water-cooled crucible 3, and a high-frequency electromagnetic field is created by inductor 4.

The lump silicon charge material 8 is downloaded from charge bin 2 into a melting space 18 created by the water-cooled crucible 3 and the movable bottom 5.

Then the start-up heating device 7 is inserted into the melting space 18 located inside a high-frequency electromagnetic field created by the inductor 4.

The start-up heating device 7 gets heated up, and the lump silicon charge material 8 warms up and begins melting under the influence of radiated heat and electromagnetic field created by the inductor 4 (FIG. 1).

The start-up heating device 7 is removed from the electromagnetic field created by the inductor 4, while in the melting space 18 a melt-pool 19 is produced in the form of its lateral section.

As a result of heat emission along the periphery of melt-pool 19, the pool is crystallized, and skull is formed which prevents the pool from spilling from the melting space 18.

After forming of the melt-pool 19, a lump silicon charge material 8 is permanently supplied onto its surface from the charging bin 2.

The lump silicon charge material 8 melts down, and at the same time, the movable bottom 5 together with the melt-pool 19 with skull is steadily moved downwardly.

The movement is at the speed which allows the melt-pool 19 to remain at an unchanged level relative to the inductor 4 and the water-cooled crucible 3, with crystallization of the multicrystalline silicon ingot 20 being effected continuously in the lower part of the melt-pool.

Figure 2:
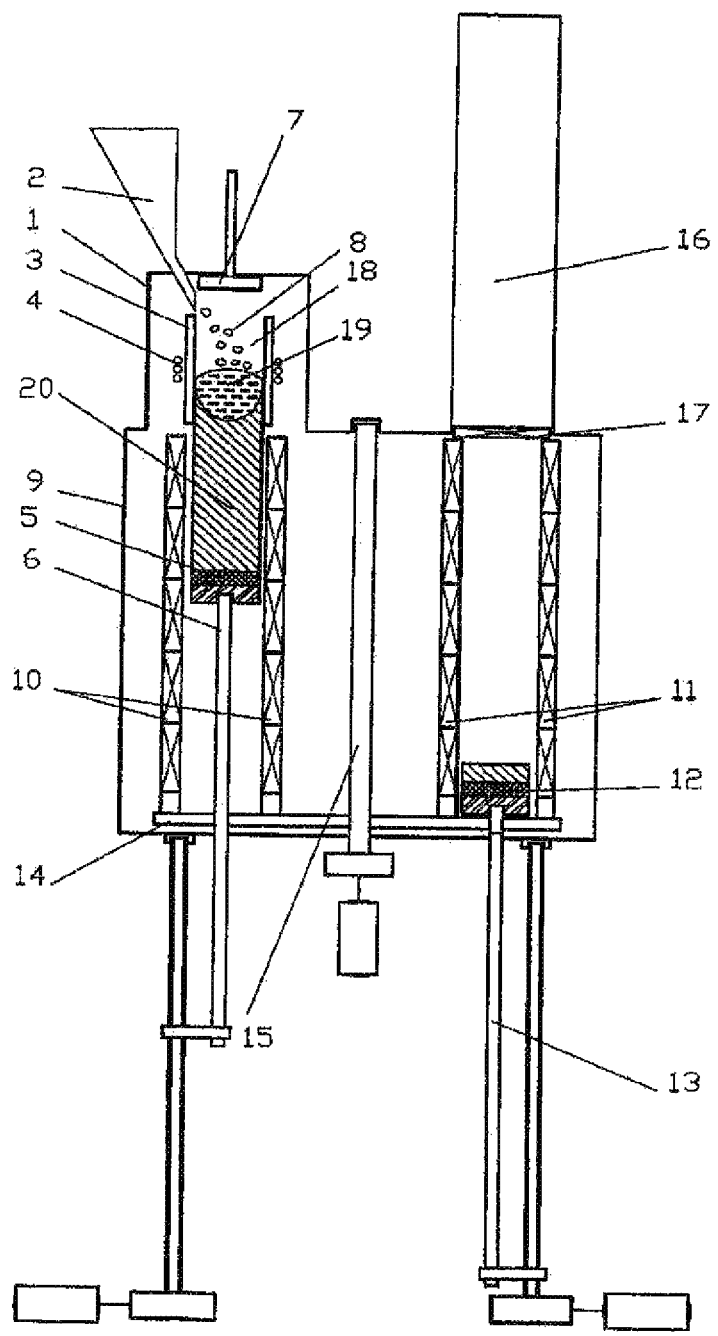
FIG. 2 shows the apparatus of FIG. 1 at the step of induction melting and casting of a multicrystalline silicon ingot.

The thereby formed multicrystalline silicon ingot 20 is steadily moved downwardly into the controlled cooling compartment 9 toward the heating equipment set 10, where controlled cooling is performed and thermal stresses are removed (FIG. 2).

Figure 3:
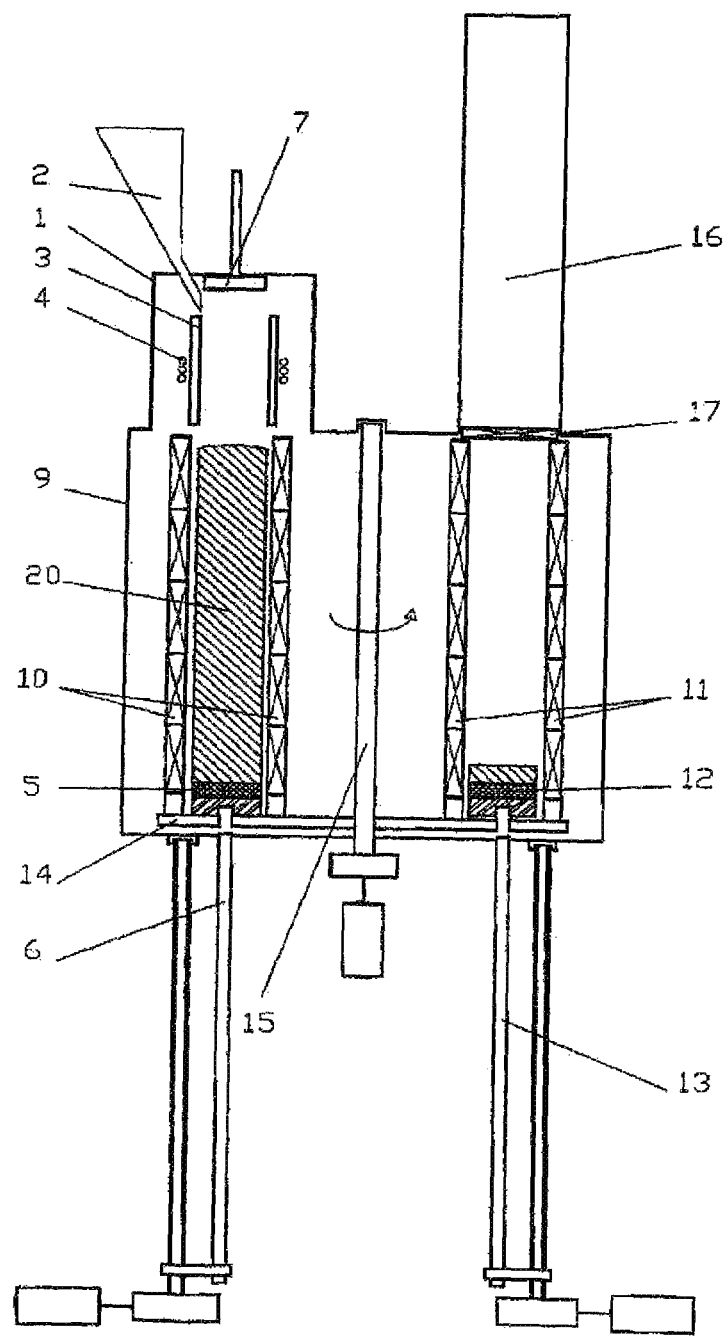
FIG. 3 illustrates the position of the multicrystalline silicon ingot before movement.

If the content of impurities in the pool becomes critical, the supply of the lump silicon charge material 8 is stopped, the electromagnetic field of the inductor 4 is removed, and the induction melting and pool casting are stopped. The produced multicrystalline silicon ingot 20 is removed from the water-cooled crucible 3, and placed into the heating equipment set 10 to terminate crystallization (FIG. 3).

Then the multicrystalline silicon ingot 20 is transferred together with the movable bottom 5 and the heating equipment set 10 (FIG. 4) by rotating the platform 14 and the controlled cooling of the ingot continues.

Such movement can be accomplished, for example, by a 180-degrees rotary turn of the platform 14 around the axis 15.

Figure 4:
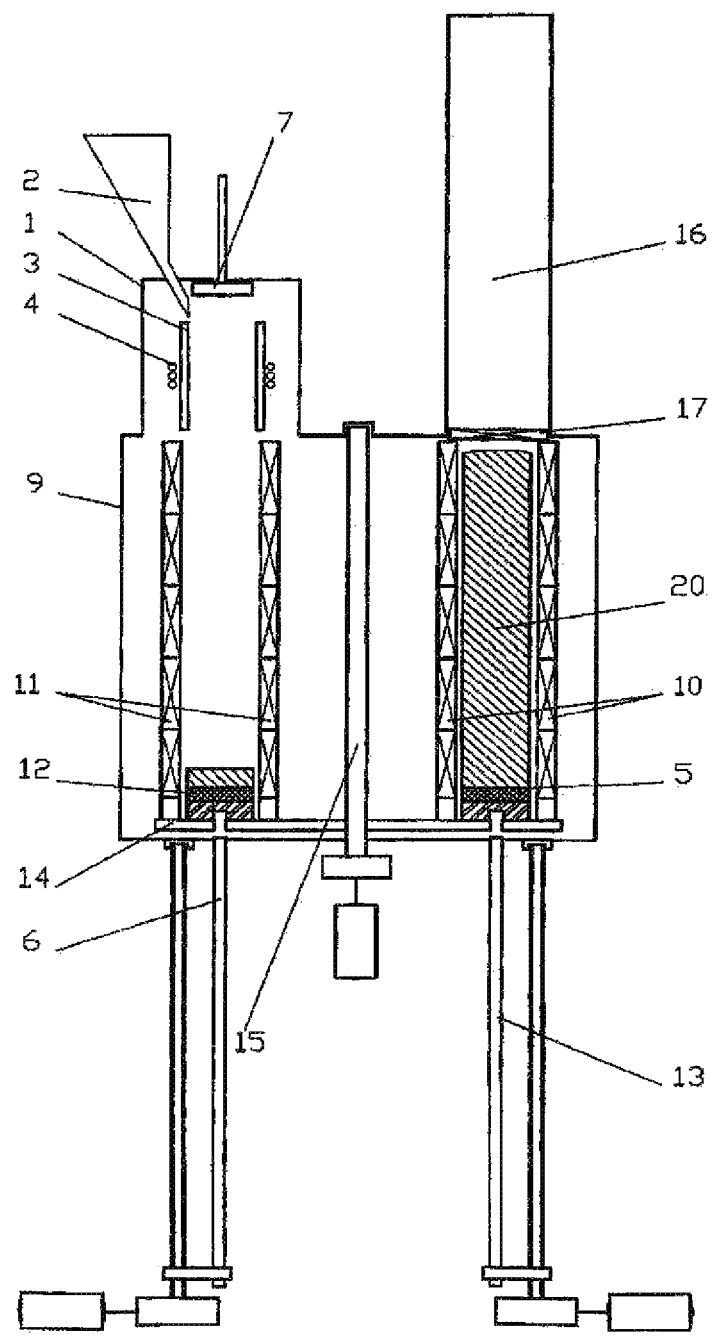
FIG. 4 illustrates the position of the multicrystalline silicon ingot after movement.

Simultaneously with relocating the multicrystalline silicon ingot 20 together with the movable bottom 5 and the heating equipment set 10, the heating equipment set 11 with the movable bottom 12 is transferred to the vacated space (FIG. 4).

The heating equipment sets 10 and 11 are electrically switched over and the algorithm of temperature regulation is changed accordingly.

Figure 5:
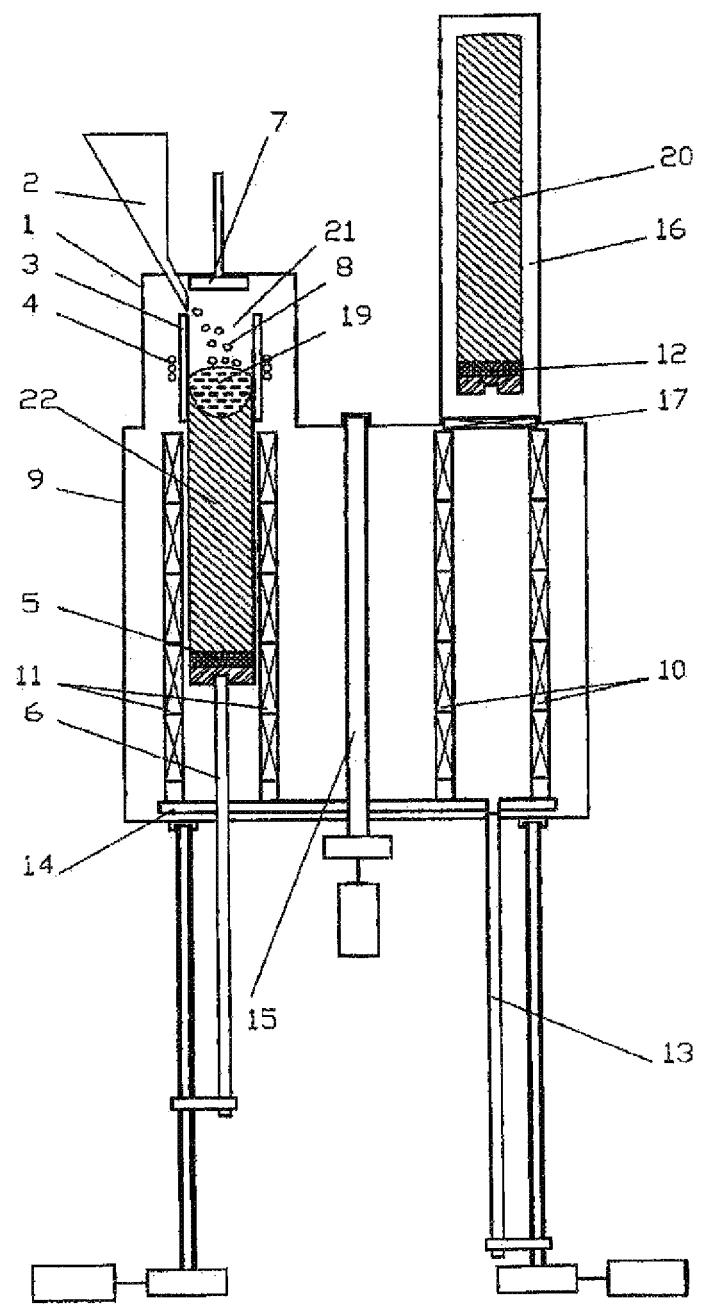
FIG. 5 shows the apparatus of FIG. 1 at the step of induction melting and casting of the next multicrystalline silicon ingot, and removal of the previous multicrystalline silicon ingot.

The movable bottom 12 is transferred to the water-cooled crucible 3, defining a new melting space 21, and the process steps are repeated starting from the supply and start-up heating of lump silicon charge material, in order to obtain a next ingot 22 (FIG. 5).

The cooled-down multicrystalline silicon ingot 20 located inside the heating equipment set 10 is moved upwardly on the movable bottom 5 into the discharge device 16.

An example of how multicrystalline silicon ingots can be obtained by the induction method according to the process of the invention with the use of the apparatus described above follows.

EXAMPLE

Multicrystalline silicon ingots are obtained using the apparatus with a melting space of a square cross-section and a side length of 340 mm.

This apparatus allows the production of multicrystalline silicon ingots with a square cross-section and a side length of 337 mm.

As a starting material for the production of multicrystalline silicon ingots, metallurgical-grade bulk silicon was used with the following usual admixtures such as boron (B), phosphorus (P), iron (Fe), and aluminum (Al).

The content of impurities in the starting material is shown in the Table below.

Additionally, an alloy was used to maintain specific resistance within the range of 0.8-1.2 Ohm×cm.

TABLE

Content of usual impurities in metallurgical-grade lump silicon batch

| Impurity | Concentration at/cm$^3$ |
| --- | --- |
| B | $5.46 * 10^{16}$ |
| P | $7.07 * 10^{16}$ |
| Al | $2.29 * 10^{16}$ |
| Fe | $1.30 * 10^{16}$ |

Figure 6:
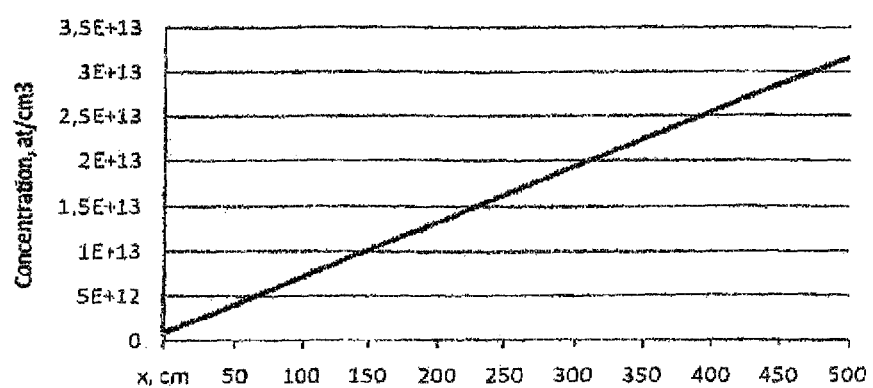
FIG. 6 illustrates a chart demonstrating changes of iron concentration over the length of the multicrystalline silicon ingot with a square cross-section (a side is 337 mm long) for the starting material specified in the Table hereinbelow.

Critical content of impurities in a pool depending on a composition of the starting material was determined by the experimental calculations. Based on this data, dependence between concentration of iron admixtures (the impurity determining quality of multicrystalline silicon) and the length of multicrystalline silicon ingot of square cross-section and the side length of 337 mm was found for the selected starting material (FIG. 6).

For the starting material with the content of impurities listed in the Table there were obtained multicrystalline silicon ingots of square cross-section and a side length of 337 mm; and the critical content of impurities is reached when the ingot gets 2.0 to 2.5 m long, an optimal length of the ingot being 2.0 to 2.3 m.

Inside an air-tight chamber, a water-cooled crucible is installed and enveloped by a 3-turn inductor of 140 mm in height connected to a source of power with an operating frequency of 10 kHz, and a movable bottom made in the form of a square silicon plate of 40 mm thick with a side length of 338 mm which is placed using a thermal insulation disk on a heat-resistant steel platform, and is attached to the rod via a plug-type connection.

In the controlled cooling compartment under the water-cooled crucible on the platform, the first heating equipment set is installed having a heating space of a square cross-section and a side length of 380 mm.

Symmetrically, the second heating equipment set is installed on the platform, having a heating space of a square cross-section and a side length of 380 mm.

The heating space of each heating equipment set is of 2.4 m in height.

Each heating equipment set is provided graphite heater elements connected to the industrial frequency transformer through the current controllers, thus allowing to ensure controlled changes of the temperature field vertically.

The second heating equipment set has another movable bottom installed using a thermal insulation disk on a heat-resistant steel platform, and attached to the rod via a plug-type connection.

The chamber was vacuumized and filled with argon.

In the melting space of the water-cooled crucible, a high-frequency electromagnetic field was created using the inductor.

Lump silicon charge material was loaded into the melting space from a charging bin, and a start-up heating device in the form of a graphite disk was inserted.

The start-up heating device was heated up, and under the influence of heat emission and electromagnetic field, the lump silicon starting material was heated to a temperature of 800-1100° C., and started melting.

The start-up heating device was removed from the inductor electromagnetic field.

A melt-pool was formed inside the melting space, which expanded and reached the walls of a cold crucible, i.e., the pool was cast in the form of the water-cooled crucible.

At the same time, a skull was formed and prevented the pool from spilling and contained the melt-pool.

Lump silicon starting material was then supplied continuously onto the pool surface from the charging bin.

The lump silicon starting material was melted, the movable bottom was steadily moved downwardly, and a multicrystalline silicon ingot was formed.

As the multicrystalline silicon ingot was melted, cast and formed, it was moved downwardly into the heating space of the first heating equipment set, where the controlled cooling and removal of thermal stresses was carried out by warming up the multicrystalline silicon ingot—already crystallized and chilled—mainly in the corners of the ingot.

The temperature was raised up to 1200° C. with a following decrease of a temperature with the gradient of no more than 7° C./cm.

Once the content of impurities in the pool becomes critical when the ingot was approximately 2.2 m long (FIG. 6), the supply of lump silicon starting material was stopped, the inductor was shut down, and induction melting and pool casting were ceased.

As a result, the melt-pool was crystallized.

The obtained multicrystalline silicon ingot, 2.2 m long, was removed from the water-cooled crucible and completely inserted into the heating space of the first heating equipment set.

Then the first heating equipment set was disconnected from the current controllers, and by a 180-degree turn of the platform round its axis, the multicrystalline silicon ingot was shifted together with the movable bottom and the first heating equipment set.

Upon completion of the platform turning, the heating equipment sets were exchanged—the second heating equipment set together with the other movable bottom turned out to be underneath the water-cooled crucible, whereas the first heating equipment set with the multicrystalline silicon ingot located inside its heating space was positioned in the place where the second heating equipment set used to be.

Then both heating equipment sets were connected to the current controllers—the second heating equipment set located under the water-cooled crucible was connected using the melting algorithm, and the first heating equipment set located out of contact with the water-cooled crucible-using the algorithm for the controlled cooling of the multicrystalline ingot.

After the multicrystalline ingot had been cooled down to a temperature below 250° C., it was lifted on the movable bottom into the discharge device.

The movable bottom located inside the heating space of the second heating equipment set, after completion of the platform turning, was transferred to the water-cooled crucible, and the process steps were repeated starting from supplying and start-up heating of the lump charge until obtaining the next ingot.

Testing of the pilot apparatus in accordance with the invention resulted in an average output of 18 kg per hour of multicrystalline silicon in the form of an ingot with a cross-section of 337×337 mm.

At the same time, it was established that neither the upper, nor the lower part of the produced ingots had any microcracks or additional impurities, and they are suitable for the production of solar cell plates, with the exception of the residual melt-pool covering the upper part of each ingot over the length of about 160 mm.

The output of good product was 93% of the obtained ingot.

Experimental melting operations based on the method described EP 1754806 using a graphite separation device allowed to reach the equipment capacity of 16.2 kg/h for a similar starting material and a similar size ingot with three operations of inserting the separation device. At the same time, in addition to the residual melt-pool, about 50 to 70 mm of the ingot were rejected due to microcracks. Graphite impurities were found in the lower part of each ingot. Such areas were up to 50 mm long and were rejected. As a result, the output of good product was 88% of the obtained ingot.

According to the present invention, the claimed apparatus and method are related to the production of multicrystalline silicon ingots with a large cross-section (330×330 mm² and greater).

Production of multicrystalline silicon ingots with specified quality is determined by the rate of crystallization of the melt at the crystallization front, which, in turn, is determined by the angle of inclination of the solidification front to the axis of the ingot.

A bath of silicon melt, when the induction method is applied, has a form of a pseudo paraboloid.

The distribution of the lifetime of minority carriers or resistivity, the solidification front on a longitudinal axial section of the ingot solidification is seen as the frontier close to the parabola.

In this case, near the top of the parabola, crystallization speed is maximum and equal to the speed of ingot pulling $v_{ig}$.

On the branches of the parabola, the rate of crystallization is less than or equal to $v_{cr}=v_{ig}*tg\alpha$, where the angle $\alpha$ is the angle between the front and the axis of the ingot.

At the same time, the quality of the ingot is determined by crystallites grown on the branches of the parabola.

The angle $\alpha$ is defined as the ratio of the cross size of the ingot and the depth of the molten bath.

Consequently, it is necessary to maintain the ratio of the transverse dimension of the ingot to the depth of the bath.

No prior art discloses and or even suggests how, in case of increasing the cross section of the ingot, to keep this ratio for saving the melt crystallization mode and the quality of the ingot.

This results also in increasing the thickness of a skull at the output from the water-cooled crucible.

Taking into account that the heat transfer conditions at the walls of the water-cooled crucible remain constant, this leads to a decrease in the surface temperature of the ingot until 1100° C. and even less (about 900° C.) for ingots with a cross-section of 340×340 mm² and appearance of ingot defects: cracks, thermal stress.

When the temperature of the ingot at the output of the cooled crucible in case of ingots of 340×340 mm² and above is raised, a plastic deformation of the skull occurs due to the increase of the hydrostatic pressure of the melt on the skull, which often leads to skull disruption, melt straits and cease of the melting process.

On the other hand, attempts to increase the temperature of an ingot of large cross-section at the outlet of the water-cooled crucible leads to increased friction forces ingot with the walls of the crucible due to the increase in hydrostatic pressure on the plastic melt skull.

Experiments on measuring the forces to be applied to the ingot with cross-section 340×340 mm² for its downward movement demonstrated the value of about 5000 N.

For keeping a skull integrity under its moving the temperature of the ingot at the output of the crucible had also to be decreased and maintained not more than 1150° C., and preferably from 900° C. to 1150° C./

Figure 7:
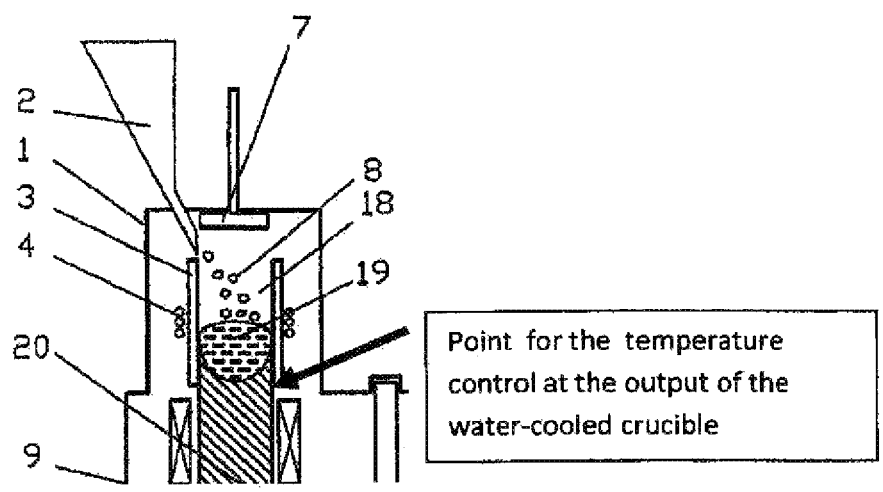
FIG. 7 illustrates where the point of temperature control for the ingot at the output of the water-cooled crucible should be placed.

FIG. 7 demonstrates where the point of temperature control for the ingot at the output of the water-cooled crucible should be placed.

The present invention provides a continuous stable process of producing multicrystalline silicon ingots with large cross-sections by the induction method by maintaining (reducing) the surface temperature of the ingot at the output of the crucible within the range of 900-1150° C., and by heating the ingot at the output of the upper zone of the controlled cooling compartment (preferably having a length equal to 20% of the total length of the cooling compartment) to a temperature of 1200-1250° C., followed by cooling of the ingot at a rate of no more than 10° C./cm.

The present invention ensures increased output of multicrystalline silicon suitable for solar cell fabrication.

The invention claimed is:

1. A process for producing multicrystalline silicon ingots by an induction method, comprising the steps of:
providing an air-tight, one-piece, unitary, integral chamber;
providing a water-cooled crucible located within said air-tight, one-piece, unitary, integral chamber;
providing an inductor coil located within said air-tight, one-piece, unitary, integral chamber and surrounding said water-cooled crucible;
providing a first movable structure located within said air-tight, one-piece, unitary, integral chamber;
providing a melting space formed by said water-cooled crucible and said movable structure;
providing a charging bin having an exit portion extending into said air-tight, one-piece, unitary, integral chamber and located and configured to download a lump silicon charge material into said first melting space;
providing a movable, start-up heating device located within said air-tight, one-piece, unitary, integral chamber and configured to be inserted into said first melting space for melting said lump silicon charge material under the influence of radiated heat and an electromagnetic field generated by said inductor coil;
providing said movable, start-up heating device being made of conductive material;
providing a first movable rod extending into said air-tight, one-piece, unitary, integral chamber;

providing said first movable rod being connected to said first movable structure for moving said first movable structure vertically within said air-tight, one-piece, unitary, integral chamber;

providing a controlled cooling compartment located within said air-tight, one-piece, unitary, integral chamber beneath said water-cooled crucible;

providing a first heating equipment set located within said controlled cooling compartment;

configuring said first movable structure to move vertically along said first heating equipment set;

providing a second movable structure located within said air-tight, one-piece, unitary, integral chamber;

providing a second melting space formed by said water-cooled crucible and said second movable structure;

providing said charging bin having said exit portion extending into said air-tight, one-piece, unitary, integral chamber and located and configured to download lump silicon charge material into said second melting space;

providing said movable, start-up heating device located within said air-tight, onepiece, unitary, integral chamber and configured to be inserted into said second melting space for melting lump silicon charge material under the influence of radiated heat and an electromagnetic field generated by said inductor coil;

providing a second movable rod extending into said air-tight, one-piece, unitary, integral chamber;

connecting said second movable rod to said second movable structure for moving said second movable structure vertically within said air-tight, one-piece, unitary, integral chamber;

providing a second heating equipment set located within said controlled cooling compartment;

mounting said heating equipment sets on a platform within said controlled cooling compartment located within said air-tight, one-piece, unitary, integral chamber beneath said water-cooled crucible;

providing a rotatable axle being located between said first and second heating equipment sets within said air-tight, one-piece, unitary, integral chamber;

configuring said platform to rotate 180-degrees around said axle;

providing a discharge device connected to said air-tight, one-piece, unitary, integral chamber through a gas seal;

charging and start-up heating lump silicon charge material in a controlled atmosphere on said first movable structure within said first melting space of said water-cooled crucible;

creating a bath of molten silicon;

melting and casting the molten silicon to the shape of said first melting space;

crystallizing a multicrystalline silcon ingot;

controllably cooling the multicrystalline silicon ingot firstly by increasing the surface temperature of said multicrystalline silicon ingot at an ouput of said water-cooled crucible from 900-1150 ° C. to a temperature of 1200-1250° C. at an output of an upper zone of said controlled cooling compartment, and then by cooling of said multicrystalline silicon ingot with a thermal gradient of no more than 10° C./cm terminating the steps of melting and casting when content of impurities in the molten silicon becomes critical;

moving the multicrystalline silicon ingot steadily downwardly into said controlled cooling compartment toward said first heating equipment set where controlled cooling is provided and thermal stresses are removed;

upon completion of crystallization, the silicon ingot is vacated together with said first movable structure and said first heating equipment set, and further cooled in a controlled manner;

at the same time, said second heating equipment set and said second movable structure are rotated on said platform into the vacated space; and moving said second movable structure into said water-cooled crucible; and repeating the steps to produce the next ingot.

\* \* \* \* \*